(12) United States Patent
Kim

(10) Patent No.: US 7,696,799 B2
(45) Date of Patent: Apr. 13, 2010

(54) DELAY CELL OF VOLTAGE CONTROLLED DELAY LINE USING DIGITAL AND ANALOG CONTROL SCHEME

(75) Inventor: Yong-Ju Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/283,810

(22) Filed: Sep. 15, 2008

(65) Prior Publication Data

US 2009/0015303 A1 Jan. 15, 2009

Related U.S. Application Data

(62) Division of application No. 11/480,668, filed on Jun. 30, 2006, now abandoned.

(30) Foreign Application Priority Data

Sep. 28, 2005 (KR) .................... 2005-0090865
Dec. 27, 2005 (KR) .................... 2005-0130863

(51) Int. Cl.
*H03L 7/06* (2006.01)

(52) U.S. Cl. ...................... 327/158; 327/159

(58) Field of Classification Search .......... 327/158, 327/159
See application file for complete search history.

(56) References Cited

U.S. PATENT DOCUMENTS 5,455,816 A * 10/1995 Bitting ................. 360/67
5,477,182 A * 12/1995 Huizer ................. 327/261
6,072,349 A * 6/2000 Pippin et al. ............. 327/307
6,130,552 A 10/2000 Jefferson et al.
6,275,079 B1 * 8/2001 Park ..................... 327/143
6,573,771 B2 6/2003 Lee et al.
6,628,154 B2 * 9/2003 Fiscus ................... 327/158
6,724,230 B2 4/2004 Hirabayashi
6,977,605 B2 12/2005 Lee et al.
6,982,579 B2 1/2006 Lee
6,987,409 B2 * 1/2006 Kim et al. .............. 327/158

FOREIGN PATENT DOCUMENTS

| JP | 2003-060501 | 2/2003 |
| JP | 2003-110423 | 4/2003 |
| KR | 10-2006-0117024 | 11/2006 |
| TW | 200523743 A | 7/2005 |

* cited by examiner

*Primary Examiner*—Lincoln Donovan
*Assistant Examiner*—Ryan C Jager
(74) *Attorney, Agent, or Firm*—Blakely, Sokoloff, Taylor & Zafman

(57) ABSTRACT

Provided is an analog/digital control delay locked loop (DLL). The DLL includes a phase detector for detecting a phase difference between an input clock signal and a feedback signal to provide an up detection signal or a down detection signal, a charge pump for generating an adjusted output current based on the up or down signals, a loop filter for low pass-filtering the output current to produce an analog control voltage, a voltage controlled delay Line (VCDL) for receiving the analog control voltage, the input clock signal and a digital code, and delaying the input clock signal based on the analog control voltage and the digital code to provide an output clock signal, a delay replica modeling unit formed by replica of delay factors for producing the feedback signal depending on the output clock signal, and a digital code generator for generating the digital code.

14 Claims, 4 Drawing Sheets

DELAY CELL OF VOLTAGE CONTROLLED DELAY LINE USING DIGITAL AND ANALOG CONTROL SCHEME

The present patent application is a Divisional of application Ser. No. 11/480,668, filed Jun. 30, 2008 now abandoned.

FIELD OF THE INVENTION

The present invention relates to semiconductor design technologies; and, more particularly, to a delay locked loop (DLL) for use in a synchronous dynamic random access memory (SDRAM), which is capable of determining a coarse delay amount by increasing an operating range of a delay cell.

DESCRIPTION OF RELATED ART

In memory designs, time taken for passing through a clock buffer inside a chip, among clock skew factors obstructing high-speed data transmission is important to determine major timing parameters of DRAM. An external clock should be accepted through the clock buffer because it is not inputted at CMOS level and also be passed through a clock driver circuit with large driving capacity for supplying an internal clock signal to many internal circuits. Therefore, the internal clock signal has a delay compared to the external clock; and various internal circuits always have a constant delay with respect to the external clock by a control of the internal clock. Thus, a clock access time tAC, which denotes time taken from receipt of the external clock to output of data, is increased by the delay component, thus causing a burden for designing a system. For the above reason, a high speed operation of DRAM is impossible. Circuits that achieve a high speed operation of memory by removing the delay components, include a phase locked loop (PLL) circuit and a DLL circuit.

Basically, the DLL includes a phase comparator for periodically comparing a phase of an external clock signal with that of an internal clock signal and detecting whether to increase or decrease the phase depending on a phase difference therebetween, a charge pump for generating a constant output voltage level based on a phase increase/decrease signal, and a loop filter for filtering a high frequency component of the output voltage level from the charge pump, like the PLL circuit. In receiving the output voltage level from the loop filter, the PLL using a voltage controlled oscillator (VCO) is distinguished from the DLL using a voltage controlled delay line (VCDL).

On the other hand, locking is very important in high speed memory. In particular, a delay tracking range of DLL is very important in a memory with a wide range of operating frequencies. Namely, because a range of control voltage becomes small in the DLL as an operating voltage is lower, it is very difficult to manufacture a chip with an operating range from hundreds of MHz to dozens of GHz.

FIG. 1 is a block diagram for describing a basic operation of a conventional analog control DLL.

Referring to FIG. 1, the conventional analog control DLL includes a phase detector 10 for receiving an input clock signal FREF and a feedback signal FEEDBACK_CLK, which is provided by modeling an output clock signal FOUT in delay factors inside a memory, and detecting a phase difference between the two signals to produce an up detection signal UP or a down detection signal DOWN, a charge pump 20 for taking the up or down detection signals UP or DOWN from the phase detector 10, and increasing an output current IC in response to the up detection signal UP and decreasing it in response to the down detection signal DOWN, a loop filter 30 for low pass-filtering the increased/decreased output current IC to generate an analog control voltage VCTRL, a voltage controlled delay line (VCDL) 40 for receiving the analog control voltage VCTRL and the input clock signal FREF and delaying the input clock signal FREF by a certain value corresponding to the analog control voltage VCTRL to provide a delayed signal as the output clock signal FOUT, and a delay replica modeling unit 50 for accepting and modeling the output clock signal FOUT in delay factors to produce the feedback signal FEEDBACK_CLK.

FIG. 2 is a block diagram for describing a configuration of the general VCDL 40 shown in FIG. 1.

The VCDL 40 may be implemented with a plurality of delay cells, 40A to 40D, which delays input clock signals IN and INB by a preset delay value and provides delayed signals as output clock signals OUTB and OUT. The input clock signals IN and INB are differential signals of the input clock signal FREF. The output clock signals OUTB and OUT output from the last delay cell 40D are differential signals of the output clock signal FOUT.

FIG. 3 shows a detailed circuit diagram of one of the plurality of delay cells of FIG. 2.

Referring to FIG. 3, each delay cell includes NMOS transistors 44 and 45 whose gates take the input clock signals IN and INB and sources are coupled to each other, a pair of symmetrical loads 42 and 43 connected between a power supply voltage VDD and each of the NMOS transistors 44 and 45, and an NMOS transistor 46 connected between the sources of the NMOS transistors 44 and 45 and ground voltage VSS. Each of the symmetrical loads 42 and 43 has a same structure, wherein each load may be composed of two PMOS transistors connected in parallel, one having a structure that its drain and gate are coupled and the other receiving an analog control voltage PCTRL via the gate to control a delay value.

In operation, inputted to the gates of the NMOS transistors 44 and 45 are the input clock signals IN and INB, which are delayed by a preset value depending on the analog control voltage PCTRL inputted to the symmetrical loads 42 and 43 to provide delayed signals as the output signals OUTB and OUT. Meanwhile, the NMOS transistor 46 connected to the VSS can compensate a variation of drain and substrate voltages in response to an analog control voltage NCTRL. The analog control voltages PCTRL and NCTRL are differential signals of the analog control voltage VCTRL shown in FIG. 1.

FIG. 4 depicts a graph for describing characteristics of the nonlinear analog control voltage VCTRL of the delay cell of FIG. 3.

Referring to FIG. 4, a horizontal axis of the graph shows the analog control voltage VCTRL and a vertical axis thereof denotes a delay time per delay cell. It can be seen that the delay time according to the analog control voltage VCTRL is varied depending on the process variation of the plurality of delay cells of FIG. 3. For example, the linear analog control voltage VCTRL approximately ranges from 0.7 V to 1 V at operation voltage of 1.5 V. Within this operating range, a typical case has a delay range from 60 ps to 32 ps, a slow case has a delay range from 99 ps to 44 ps, and a fast case has a delay range from 40 ps to 23 ps. In this case, speed binning of product should be used according to the process. Furthermore, in the slow case, a large variation of delay is caused, in spite of a small variation of control voltage VCTRL by noise. Accordingly, the DLL circuit is very sensitive to noise when it operates in a wide frequency range. Conversely, in the fast case, a stable delay can be guaranteed in operating in a wide frequency range, but a wide range of delay operations cannot be performed.

SUMMARY OF THE INVENTION

It is, therefore, an object of the present invention to provide a delay cell circuit of VCDL using a digital and analog control scheme for maximizing its operating range through a combination of a digital control and an analog control.

In accordance with an aspect of the present invention, there is provided an analog/digital control DLL including: a phase detector for receiving an input clock signal and a feedback signal and detecting a phase difference between the two signals to provide an up detection signal or a down detection signal; a charge pump for taking the up detection signal or the down detection signal and generating an adjusted output current based on the signals; a loop filter for low pass-filtering the output current to produce an analog control voltage; a VCDL for receiving the analog control voltage, the input clock signal and a digital code, and delaying the input clock signal based on the analog control voltage and the digital code to generate an output clock signal; a delay replica modeling unit formed by replicas of a delay factor for receiving the output clock signal and producing the feedback signal; and a digital code generator for generating the digital code.

Preferably, the VCDL includes a plurality of delay cells connected in series, and each delay cell includes: a differential input transistor unit for receiving differential input clock signals; an analog control transistor unit whose one terminal is connected to a power supply terminal for adjusting a fine delay amount in response to analog control voltages; and a digital control transistor unit connected between the analog control transistor unit and the differential input transistor unit for adjusting a coarse delay amount in response to a digital code. In addition, the delay cell of the VCDL further includes first and second output nodes connected to each drain of transistors included in the differential input transistor unit for generating differential output clock signals, respectively.

Preferably, the analog control transistor unit includes: an analog control load transistor circuit whose one terminal is connected to the power supply terminal, driven in response to a first analog control voltage; and an analog control current source transistor circuit whose one terminal is connected to a ground voltage terminal, driven in response to a second analog control voltage. The digital control transistor unit includes: a digital control load transistor circuit connected between the other terminal of the analog control load transistor circuit and the first and second output nodes, driven in response to the digital code; and a digital control current source transistor circuit connected between the common source of the differential input transistor unit and the analog control current source transistor circuit, driven in response to a complementary value of the digital code.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a delay locked loop (DLL) circuit in accordance with the present invention will be set forth in detail with reference to the accompanying drawings so that the invention can be readily carried out by those in the art to which the invention pertains.

Figure 5:
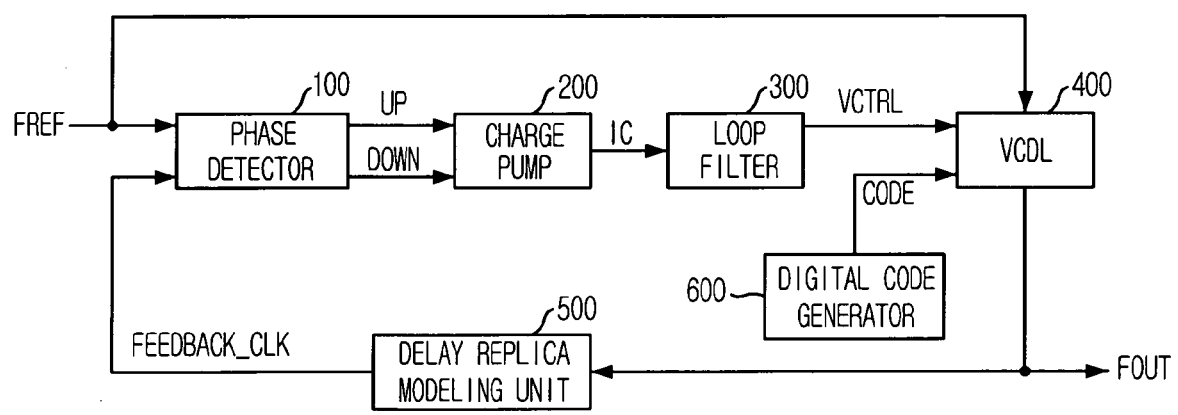
FIG. 5 shows a block diagram for describing a basic operation of an analog/digital control DLL circuit having a digital code generator in accordance with an embodiment of the present invention.

FIG. 5 shows a block diagram for describing a basic operation of an analog/digital control DLL circuit having a digital code generator 600 in accordance with an embodiment of the present invention.

Referring to FIG. 5, the analog/digital control DLL circuit of the present invention includes a phase detector 100 for receiving an input clock signal FREF and a feedback signal FEEDBACK_CLK, which is provided by modeling an output clock signal FOUT in delay factors, and detecting a phase difference therebetween to provide an up detection signal UP or a down detection signal DOWN, a charge pump 200 for taking the up or down detection signals UP or Down from the phase detector 100, and increasing an output current IC in response to the up detection signal UP and decreasing it in response to the down detection signal DOWN, a loop filter 300 for low pass-filtering the increased/decreased output current IC to produce an analog control voltage VCTRL, a VCDL 400 for receiving the analog control voltage VCTRL, the input clock signal FREF and a digital code, and delaying the input clock signal FREF by a certain value that corresponds to the digital code and the analog control voltage VCTRL to generate a delayed signal as the output clock signal FOUT, a delay replica modeling unit 500 for receiving and modeling the output clock signal FOUT in the delay factors to provide the feedback signal FEEDBACK_CLK, and a digital code generator 600 for generating the digital code by using a fuse option, a register control and a digital filter.

In operation, the phase detector 100 receives the input clock signal FREF and the feedback signal FEEDBACK_CLK, which is derived by modeling the output clock signal Fout in the delay factors, and issues the up detection signal UP if a phase of the input clock signal FREF precedes that of the feedback signal FEEDBACK_CLK and the down detection signal DOWN if the phase of the input clock signal FREF lags that of the feedback signal FEEDBACK_CLK. In response to the up detection signal UP from the phase detector 100, the charge pump 200 increase and outputs the output current IC; and in response to the down detection signal DOWN, it decrease and outputs the output current IC. Thereafter, the increased/decreased output current IC is delivered from the charge pump 200 to the loop filter 300 that low pass-filters to create the analog control voltage VCTRL.

In the meantime, the digital code generator 600 produces the digital code to control an operation of the VCDL 400. The VCDL 400, which accepts the input clock signal FREF, the analog control voltage VCTRL from the loop filter 300 and the digital code from the digital code generator 600, delays the the input clock signal FREF by a predetermined value that is based on the digital code and the analog control voltage VCTRL to output a delayed signal as the output clock signal FOUT. The delay replica modeling unit 500 takes and models the clock output signal FOUT in the delay factors to produce the feedback signal FEEDBACK_CLK. In other words, the delay replica modeling unit 500 models the clock path of the input clock signal FREF inside the chip in order to synchronize the data output from the chip with the clock input to the chip.

In the digital code generator 600 that generates the digital code, in order to have different functions in various modes, it can be implemented by a fuse option that selects a corresponding mode by using metal mask differently, applying wire bonding differently, or cutting fuse at the last step of the process. And also, it may be implemented by a register control that chooses a corresponding mode by changing a value stored therein. Alternatively, it may be implemented with a digital filter. Since the technical implementation of such digital code generator 600 is obvious to those skilled in the art, details thereof will be omitted here.

Figure 6:
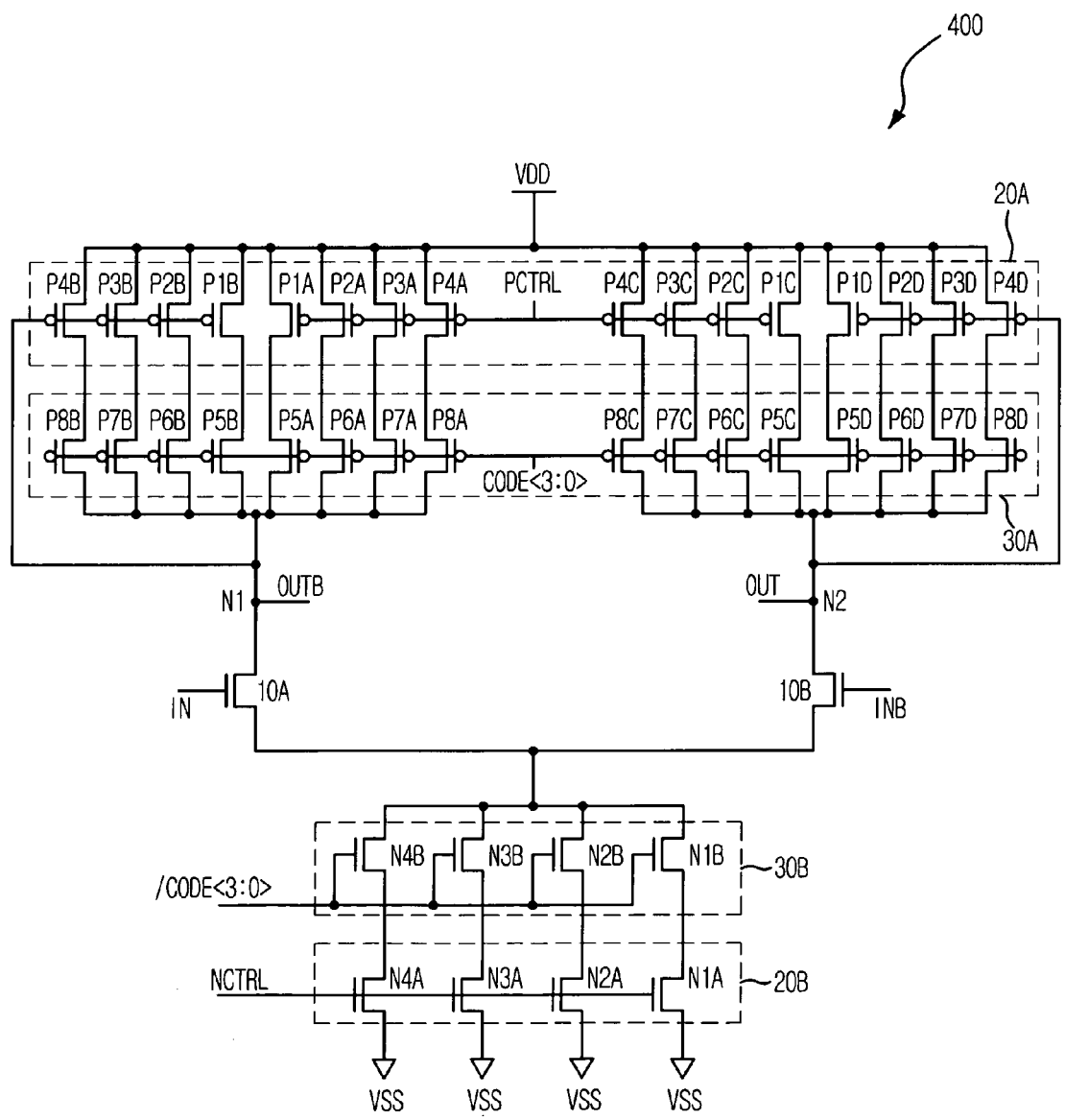
FIG. 6 exemplifies a schematic circuit diagram of one of delay cells in VCDL in accordance with an embodiment of the present invention.

FIG. 6 exemplifies a detailed circuit diagram of one of a plurality of delay cells of the VCDL 400 in accordance with an embodiment of the present invention.

Figure 1:
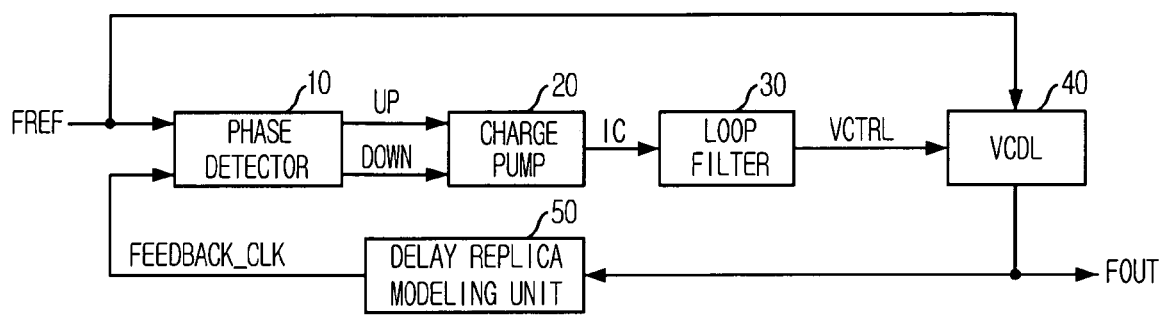
FIG. 1 is a block diagram for describing a basic operation of a conventional analog control DLL.
Figure 2:
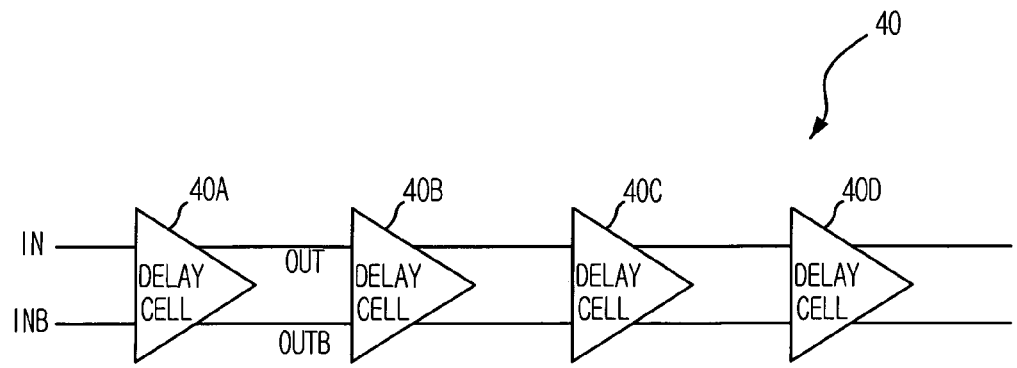
FIG. 2 is a block diagram for describing a configuration of the general voltage controlled delay line (VCDL) 40 shown in FIG. 1.
Figure 3:
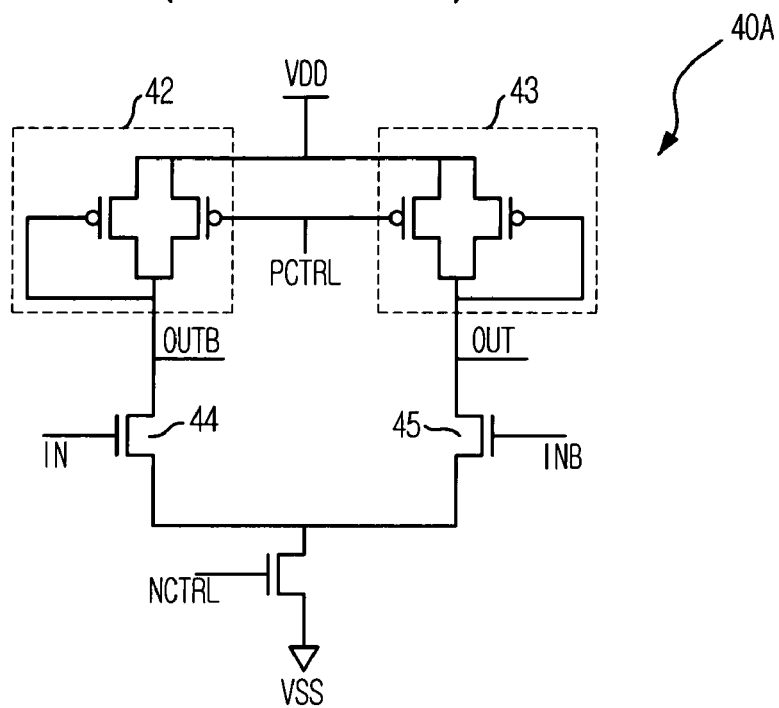
FIG. 3 shows a schematic circuit diagram of one of a plurality of delay cells of FIG. 2.
Figure 4:
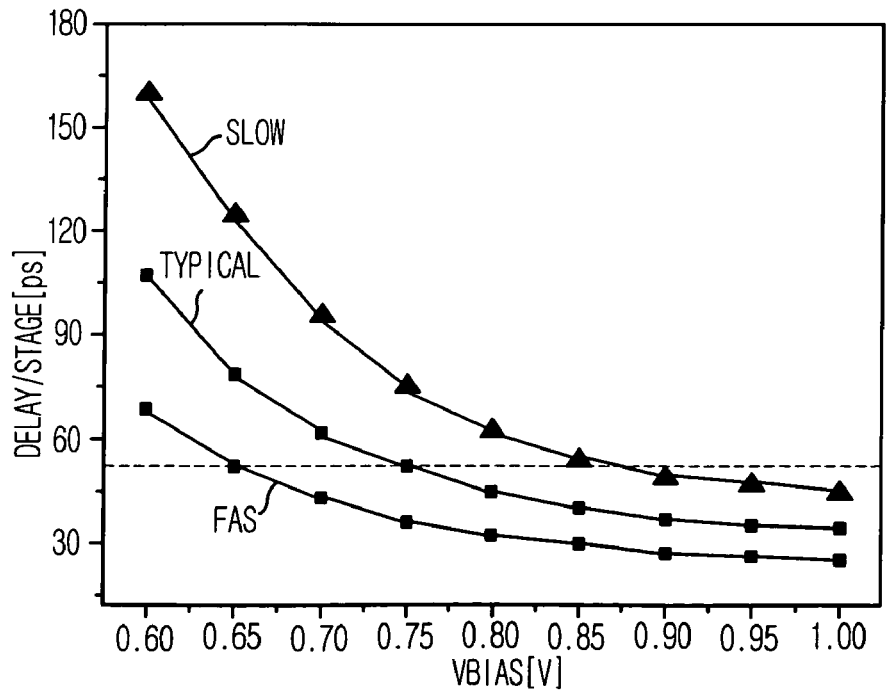
FIG. 4 depicts a graph for describing characteristics of the nonlinear analog control voltage of the delay cell of FIG. 3.

Referring to FIG. 6, the VCDL 400 of the invention also includes a plurality of delay cells 40a to 40d coupled in serial, as shown in FIG. 2. Each of the plurality of delay cells included in the VCDL 400 of the present invention includes a differential input transistor unit 10a and 10b for receiving differential input clock signals IN and INB, an analog control transistor unit 20a and 20b whose one terminal is connected to power supply terminals VDD and VSS for adjusting a fine delay amount in response to the analog control voltages PCTL and NCTL, and a digital control transistor unit 30a and 30b connected between the analog control transistor unit 20a and 20b and the differential input transistor unit 10a and 10b for adjusting a coarse delay amount in response to the digital code <3:0>. In addition, it further includes first and second output nodes N1 and N2 connected to each drain of the differential input transistor unit 10a and 10b to output differential output clock signals OUTB and OUT.

The analog control transistor unit 20a and 20b includes an analog control load transistor circuit 20a whose one terminals are connected to the power supply voltage terminal VDD, driven in response to the first analog control voltage PCTL, and an analog control current source transistor circuit 20b whose one terminals are connected to the ground voltage terminal VSS, driven in response to the second analog control voltage NCTL. And, the digital control transistor unit 30a and 30b includes a digital control load transistor circuit 30a connected between the other terminal of the analog control load transistor circuit 20a and the first and second output nodes N1 and N2, driven in response to the digital code <3:0>, and a digital control current source transistor circuit 30b connected between the common source of the differential input transistor unit 10a and 10b and the analog control current source transistor circuit 20b, driven in response to a complementary value of the digital code <3:0>.

More specifically, the analog control load transistor circuit 20a is provided with a plurality of unit symmetrical loads p1a to p1d, p2a to p2d, p3a to p3d, or p4a p4d having a symmetrical structure with respect to the first and second output nodes N1 and N2. Any one of the unit symmetrical loads, p1a to p1d, is composed of the unit load p1a and p1b having a pair of transistors with a first transistor p1a taking the first analog voltage pctl via its gate and a second transistor p1b whose gate and drain are commonly connected. Namely, the unit load p1a and p1b and the unit load p1c and p1d are symmetrical to each other to form the unit symmetrical load p1a to p1d.

The digital control load transistor circuit 30a is implemented with a plurality of transistors that corresponds to the number of transistors p1a to p1d, p2a to p2d, p3a to p3d, and p4a to p4d of the analog control load transistor circuit 20a and is controlled by the digital code <3:0> of bit number, 4 bits, that corresponds to the unit symmetrical load p1a to p1d. The transistors of the digital control load transistor circuit 30a, p5a to p5d, p6a to p6d, p7a to p7d, and p8a to p8d, receive the same code <3:0> that corresponds to the unit symmetrical loads of the analog control load transistor circuit 20a via gates.

For example, the code <0> corresponding to the unit symmetrical load p1a to p1d of the analog control load transistor circuit 20a is applied to the gates of the transistors p5a to p5d of the digital control load transistor circuit 30a; and the code <1> corresponding to the unit symmetrical load p2a to p2d is inputted to the gates of the transistors p6a to p6d of the digital control load transistor circuit 30a. Similarly, the code <2> corresponding to the unit symmetrical load p3a to p3d is provided to the gates of the transistors p7a to p7d of the digital control load transistor circuit 30a; and the code <3> corresponding to the unit symmetrical load p4a to p4d is inputted to the gates of the transistors p8a to p8d of the digital control load transistor circuit 30a.

The analog control current source transistor circuit 20b is composed of a plurality of transistors, n1a, n2a, n3a and n4a, which corresponds to the number (i.e., 4) of the unit symmetrical loads of the analog control load transistor circuit 20a. And, the digital control current source transistor circuit 30b is composed of a plurality of transistors, n1b, n2b, n3b and n4b, which correspond to the number of the analog control current source transistor circuit 20b.

On the other hand, a delay time of the delay cell is proportional to Cb/gm. Here, Cb is formed by junction capacitance and routing capacitance of a PMOS transistor and a NMOS transistor of the delay cell, and gate capacitance of a next delay cell. And, gm is decided based on B of a PMOS transistor and a voltage level of PCTRL. To adjust the coarse delay amount, it is designed to correspond to the overall process variation by binary-weighting a gate input of a PMOS transistor used at the loads. Further, it is also designed to meet falling time and a swing level by binary-weighting tail current. Accordingly, the coarse delay amount is first decided by adjusting gm and tail current of the PMOS transistor by a selection of the digital code <3:0>; and then the required fine delay amount is decided by adjusting the analog control voltages PCTL and NCTL.

In other words, the differential input clock signals IN and INB inputted to the differential input transistor unit 10a and 10b enable the adjustment of the coarse delay amount by the digital control transistor unit 30a and 30b that is responsive to the digital code <3:0> and also of the fine delay amount by the analog control transistor unit 20a and 20b that is responsive to the analog control voltages PCTL and NCTL.

As described above, the present invention can prevent speed binning by the DLL by securing a wide operating range of the delay cell through both the digital control and the analog control.

The present application contains subject matter related to Korean patent application No. 2005-90865 & 2005-130863, filed with the Korean Patent Office on Sep. 28, 2005 & Dec. 27, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

The invention claimed is:

1. An analog/digital control delay locked loop (DLL) comprising:
   a phase detector for receiving an input clock signal and a feedback signal and detecting a phase difference between the two signals to provide one of an up detection signal and a down detection signal;
   a charge pump for receiving one of the up detection signal and the down detection signal and generating an adjusted output current based on the signals;
   a loop filter for low pass-filtering the output current to produce an analog control voltage;
   a voltage controlled delay line (VCDL) for receiving the analog control voltage, the input dock signal and a digital code, and delaying the input clock signal based on the analog control voltage and the digital code to generate an output clock signal;
   a delay replica modeling unit formed by replicas of a delay factor for receiving the output clock signal and producing the feedback signal; and
   a digital code generator for generating the digital code,
   wherein the VCDL includes a plurality of delay cells connected in services, and each delay cell includes:
   a differential input transistor unit for receiving differential input clock signals;
   an analog control transistor unit whose one terminal is connected to a power supply terminal for adjusting a first delay amount in response to analog control voltages; and
   a digital control transistor unit connected between the analog control transistor unit and the differential input transistor unit for adjusting a second delay amount in response to a digital code, wherein said first delay amount is less than said second delay amount.

2. The analog/digital control DLL as recited in claim 1, wherein the digital code generator is implemented by a fuse option.

3. The analog/digital control DLL as recited in claim 1, wherein the digital code generator is implemented by a register control.

4. The analog/digital control DLL as recited in claim 1, wherein the digital code generator is implemented with a digital filter.

5. The analog/digital control DLL as recited in claim 1, further comprising first and second output nodes connected to each drain of a plurality of transistors included in the differential input transistor unit for generating differential output clock signals, respectively.

6. The analog/digital control DLL as recited in claim 5, wherein the analog control transistor unit includes:
   an analog control load transistor circuit whose one terminal is connected to the power supply terminal, being driven in response to a first analog control voltage; and
   an analog control current source transistor circuit whose one terminal is connected to a ground voltage terminal, being driven in response to a second analog control voltage.

7. The analog/digital control DLL as recited in claim 6, wherein the digital control transistor unit includes:
   a digital control load transistor circuit connected between the other terminal of the analog control load transistor circuit and the first and second output nodes, driven in response to the digital code; and
   a digital control current source transistor circuit connected between the common source of the differential input transistor unit and the analog control current source transistor circuit, driven in response to a complementary value of the digital code.

8. The analog/digital control DLL as recited in claim 6, wherein the analog control load transistor circuit includes a plurality of unit symmetrical loads having a symmetrical structure with respect to the first and second output nodes.

9. The analog/digital control DLL as recited in claim 8, wherein each of the unit symmetrical loads has a pair of transistors with a first transistor taking the first analog voltage via a gate and the other transistor whose gate and drain are commonly connected.

10. The analog/digital control DLL as recited in claim 9, wherein the digital control load transistor circuit is controlled by a digital code of bit number that corresponds to the unit symmetrical loads.

11. The analog/digital control DLL as recited in claim 10, wherein the digital control load transistor circuit includes a plurality of transistors that corresponds to the number of transistors included in the analog control load transistor circuit.

12. The analog/digital control DLL as recited in claim 11, wherein each transistor of the digital control load transistor circuit, which corresponds to the unit symmetrical load of the analog control load transistor circuit, receives a same code via a gate.

13. The analog/digital control DLL as recited in claim 5, wherein the analog control current source transistor circuit includes a plurality of transistors that corresponds to the number of the unit symmetrical loads of the analog control load transistor circuit.

14. The analog/digital control DLL as recited in claim 13, wherein the digital control current source transistor circuit includes a plurality of transistors that corresponds to the number of transistors included in the analog control current source transistor circuit.

* * * * *